(12) United States Patent
Suzuki

(10) Patent No.: US 11,276,591 B2
(45) Date of Patent: Mar. 15, 2022

(54) SUBSTRATE PROCESSING APPARATUS

(71) Applicant: Tokyo Electron Limited, Tokyo (JP)

(72) Inventor: Satoshi Suzuki, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 149 days.

(21) Appl. No.: 16/562,741

(22) Filed: Sep. 6, 2019

(65) Prior Publication Data

US 2020/0144085 A1    May 7, 2020

(30) Foreign Application Priority Data

Nov. 5, 2018    (JP) .............................. JP2018-208321

(51) Int. Cl.
    *H01L 21/67*      (2006.01)
    *H01L 21/683*      (2006.01)
    *H01J 37/32*      (2006.01)

(52) U.S. Cl.
CPC .... *H01L 21/67126* (2013.01); *H01J 37/3244* (2013.01); *H01J 37/32715* (2013.01); *H01L 21/67069* (2013.01); *H01L 21/6833* (2013.01); *H01J 37/32091* (2013.01); *H01J 2237/002* (2013.01); *H01J 2237/20235* (2013.01); *H01J 2237/3341* (2013.01)

(58) Field of Classification Search
CPC ............. H01L 21/6833; H01L 37/3244; H01L 21/67069; H01L 21/67109; H01L 21/68742; H01L 21/67126; H01L 21/6831; H01L 21/68785; H01J 37/32715; H01J 2237/002; H01J 2237/3341; H01J 37/32091; H01J 2237/20235

See application file for complete search history.

(56) References Cited

U.S. PATENT DOCUMENTS

| | | | |
|---|---|---|---|
| 2003/0160568 A1* | 8/2003 | Arai ................... | H01L 21/67109 315/111.21 |
| 2004/0115947 A1* | 6/2004 | Fink ................... | H01L 21/67103 438/716 |
| 2004/0163601 A1* | 8/2004 | Kadotani .......... | H01L 21/67109 118/728 |
| 2019/0131163 A1* | 5/2019 | Kuno ................ | H01L 21/67103 |

FOREIGN PATENT DOCUMENTS

JP      2016-191477 A    11/2016

* cited by examiner

*Primary Examiner* — Yuechuan Yu
(74) *Attorney, Agent, or Firm* — Pearne & Gordon LLP

(57) ABSTRACT

An inside of a processing vessel is set to be in a vacuum atmosphere when a substrate processing is performed. A sealing member is provided with a pipe-shaped cavity formed between a low-temperature region having a relatively low temperature and a high-temperature region having a relatively high temperature when the substrate processing is performed. The sealing member is configured to seal the processing vessel.

17 Claims, 8 Drawing Sheets

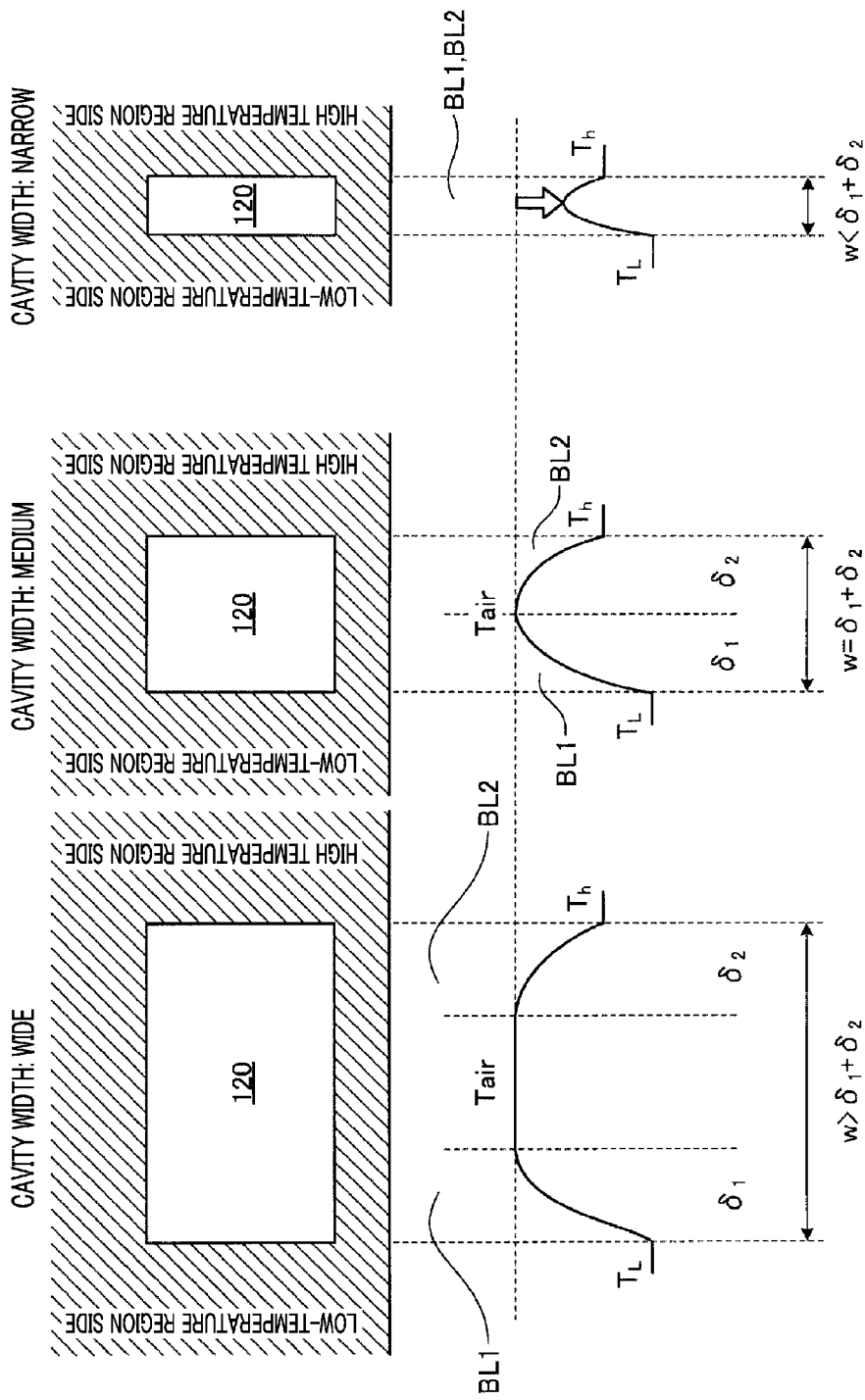

SUBSTRATE PROCESSING APPARATUS

CROSS-REFERENCE TO RELATED APPLICATION

This application claims the benefit of Japanese Patent Application No. 2018-208321 filed on Nov. 5, 2018, the entire disclosure of which are incorporated herein by reference.

TECHNICAL FIELD

The various aspects and embodiments described herein pertain generally to a substrate processing apparatus.

BACKGROUND

Patent Document 1 describes an active magnetic regenerator using a solid as a heat transport medium and discloses a technique of providing a heat transfer portion and a heat insulation portion alternately in the heat transport medium to allow thermal conductivity of the heat transport medium to be anisotropic.

Patent Document 1: Japanese Patent Laid-open Publication No. 2016-191477

SUMMARY

In one exemplary embodiment, a substrate processing apparatus includes a processing vessel and a sealing member. Inside of the processing vessel is set to be in a vacuum atmosphere when a substrate processing is performed. The sealing member is provided with a pipe-shaped cavity formed between a low-temperature region having a relatively low temperature and a high-temperature region having a relatively high temperature when the substrate processing is performed. The sealing member is configured to seal the processing vessel.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 6A to FIG. 6C are diagrams schematically illustrating a relationship between a width of a cavity and a thermal boundary layer;

DETAILED DESCRIPTION

Figure 1:
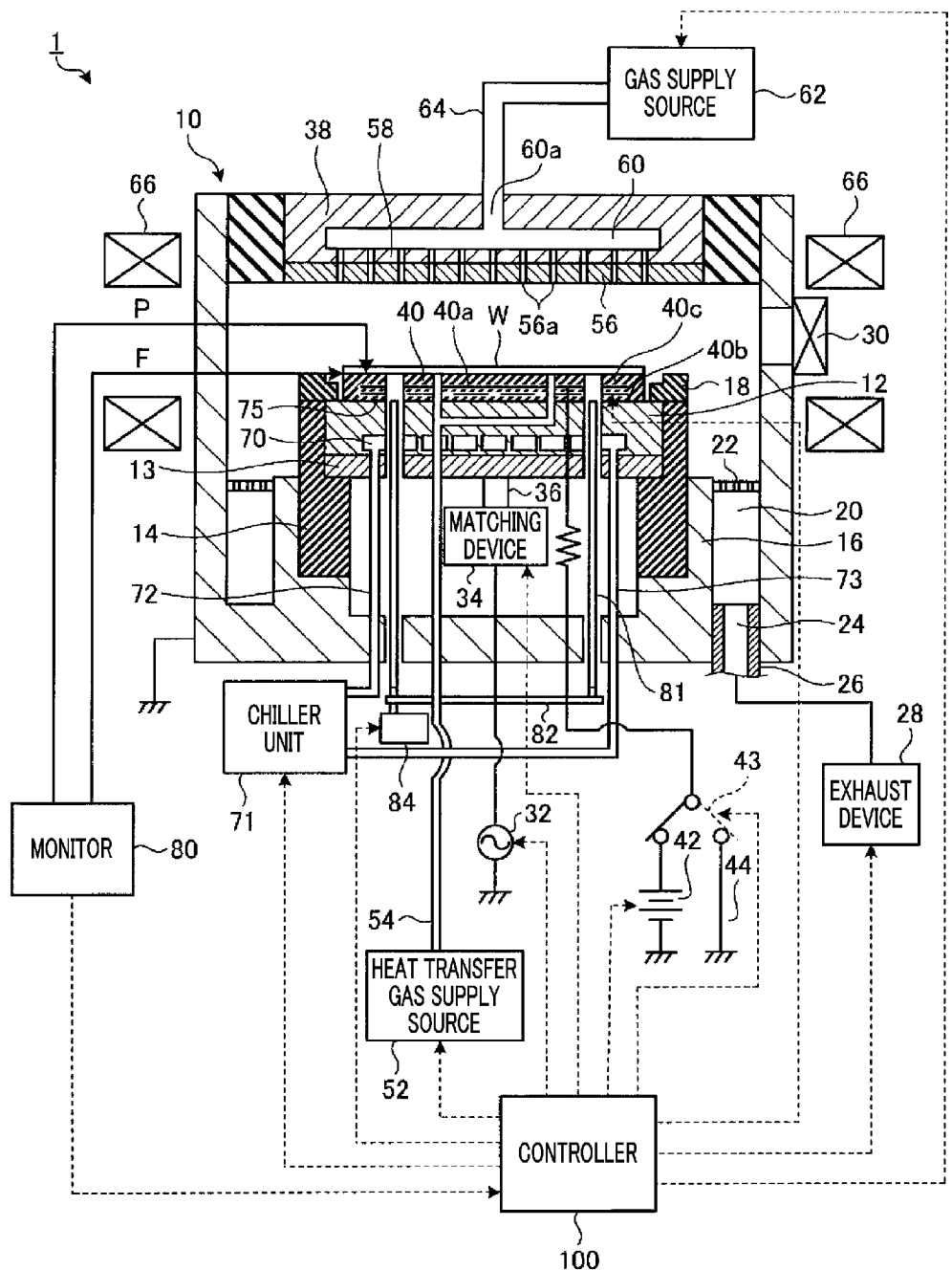
FIG. 1 is a schematic configuration view of an example substrate processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, a substrate processing apparatus according to an exemplary embodiment of the present disclosure will be described in detail with reference to the accompanying drawings. However, it should be noted that the exemplary embodiment is not meant to be anyway limiting.

There is a substrate processing apparatus such as a plasma processing apparatus which performs a substrate processing at a low temperature. By way of example, there is known a plasma processing apparatus in which a path is formed in a processing vessel or the like and etching is performed on a substrate such as a semiconductor wafer at a low temperature which is set by circulating a coolant in the path. However, a component, which may suffer performance degradation or a problem with a decrease of the temperature, may be disposed in the substrate processing apparatus. By way of example, a moving component such as a lifter pin configured to move the substrate up and down is disposed in the plasma processing apparatus. To maintain mobility of this moving component, grease is coated on a portion which is in contact with this moving component. At a low temperature, however, an effect of the grease is deteriorated and abrasion increases. As a result, a problem is caused at the contact portion. To avoid this problem, it is desirable to design the substrate processing apparatus such that the moving component is distanced away from the low-temperature region as far as possible. However, it may not be possible to dispose the moving component far from the low-temperature region in layout with respect to other components. In this regard, it is required to suppress transmission of heat (heat transmission) to a region where the moving component or the like is disposed.

[Configuration of Substrate Processing Apparatus]

Now, a configuration example of the substrate processing apparatus according to the present exemplary embodiment will be discussed. The present exemplary embodiment is described for an example case where the substrate processing apparatus is configured as a parallel plate type (also referred to as capacitively coupled) plasma processing apparatus configured to perform a plasma processing such as a RIE (Reactive Ion Etching) processing or an aching processing on a semiconductor wafer W (hereinafter, simply referred to as "wafer") as a target object. However, the substrate processing apparatus is not particularly limited to the plasma processing apparatus.

FIG. 1 is a schematic configuration view illustrating an example of the substrate processing apparatus according to the present exemplary embodiment.

The substrate processing apparatus 1 according to the present exemplary embodiment includes a cylindrical processing vessel 10 made of a metal such as, but not limited to, aluminum or stainless steel. The processing vessel 10 is generally grounded. Within the processing vessel 10, a plasma processing such as an etching processing is performed on the wafer W.

A placing table 12 configured to place the wafer W thereon is provided within the processing vessel 10. The placing table 12 is made of, by way of non-limiting example, aluminum, titanium or SiC. A support 13 made of, for example, aluminum, titanium, SiC or the like is disposed under the placing table 12. Further, an insulating cylindrical holder 14 is placed around the placing table 12. The placing table 12 and the support 13 are supported by the cylindrical holder 14 from the side thereof. The cylindrical holder 14 is supported at a cylindrical support 16 vertically extending upwards from a bottom of the processing vessel 10. The processing vessel 10 has an opening at a lower portion thereof to accommodate therein pipelines 72 and 73 to be described later, a gas supply line 54, lifter pins 81, and so forth. The opening is in an atmospheric environment. Further, the processing vessel 10 also has an opening at an upper portion thereof. The opening at the lower portion of the processing vessel 10 is sealed by the support 13 and the cylindrical holder 14, and the opening at the upper portion of the processing vessel 10 is sealed by a shower head 38 to be described later. Accordingly, the inside of the processing vessel 10 is hermetically sealed. The outside of the processing vessel 10 is in an atmospheric environment. The support 13 and the cylindrical holder 14 serve as sealing members configured to seal the lower portion of the processing vessel 10. The support 13 and the cylindrical holder 14 have a mechanical strength not to be bent or distorted by a force generated by a pressure difference between the inside and the outside of the processing vessel.

A focus ring 18 made of, by way of example, quartz is provided on a top surface of the cylindrical holder 14 to surround a top surface of the placing table 12 in a ring shape. The focus ring 18 allows plasma generated above the placing table 12 to be concentrated toward the wafer W.

An exhaust path 20 is formed between an inner sidewall of the processing vessel 10 and an outer sidewall of the cylindrical support 16. An annular baffle plate 22 is placed in the exhaust path 20. An exhaust port 24 is provided in a bottom of the exhaust path 20, and the exhaust port 24 is connected to an exhaust device 28 via an exhaust pipe 26.

The exhaust device 28 has a non-illustrated vacuum pump and is configured to decompress the inside of the processing vessel 10 to a vacuum atmosphere when a substrate processing is performed. By way of example, the exhaust device 28 decompresses the inside of the processing vessel 10 to a preset vacuum level. Provided at a sidewall of the processing vessel 10 is a gate valve 30 which is configured to be opened or closed when the wafer W is carried in and out.

A high frequency power supply 32 for plasma generation is electrically connected to the placing table 12 and the support 13 via a power feed rod 36 and a matching device 34. The high frequency power supply 32 applies a high frequency power of, e.g., 60 MHz to the placing table 12. In this configuration, the placing table 12 and the support 13 also serve as a lower electrode.

The shower head 38 is provided at a ceiling of the processing vessel 10 to serve as an upper electrode of a ground potential. The high frequency power for plasma generation from the high frequency power supply 32 is capacitively applied between the placing table 12 and the shower head 38.

An electrostatic chuck (ESC) 40 configured to hold the wafer W by an electrostatic attracting force is provided on the top surface of the placing table 12. The electrostatic chuck 40 has dielectric layers 40b and 40c as a pair of dielectric members and a sheet-shaped chuck electrode 40a embedded therebetween. The chuck electrode 40a is made of a conductive film and is connected to a DC voltage source 42 via a switch 43. In general, prominences and depressions are formed on a wafer placing surface of the electrostatic chuck 40 on which the wafer W is placed. By way of example, these prominences and depressions can be formed by embossing-finishing the electrostatic chuck 40.

The wafer W is attracted to and held on the electrostatic chuck 40 by an attracting force generated by a voltage applied from the DC voltage source 42. Further, when the voltage is not applied to the chuck electrode 40a, the electrostatic chuck 40 is kept connected to a grounding part 44 via the switch 43.

A heat transfer gas supply source 52 is configured to supply a heat transfer gas such as a helium (He) gas to a rear surface of the wafer W on the electrostatic chuck 40 via a gas supply line 54.

The shower head 38 disposed at the ceiling includes an electrode plate 56 having a multiple number of gas holes 56a; and an electrode supporting body 58 configured to support the electrode plate 56 in a detachable manner. A buffer room 60 is provided within the electrode supporting body 58, and a gas supply source 62 is connected to a gas inlet 60a of the buffer room 60 via a gas supply line 64. With this configuration, a required processing gas is supplied into the processing vessel 10 from the shower head 38.

A plurality of, e.g., three lifter pins 81 are provided within the placing table 12. The lifter pins 81 are configured to move the wafer W up and down to transfer the wafer W to/from a non-illustrated external transfer arm. These lifter pins 81 are moved up and down by a motive power of a motor 84 which is delivered via a connecting member 82.

Magnets 66 are disposed around the processing vessel 10. The magnets 66 extends annularly around or concentrically with the processing vessel 10, and arranged in two levels. Within the processing vessel 10, an RF electric field is vertically formed in a plasma generating space between the shower head 38 and the placing table 12 by the high frequency power supply 32. Due to a high frequency discharge, high-density plasma is generated in the vicinity of a front surface of the placing table 12.

A coolant path 70 is typically provided within the placing table 12. A coolant of a preset temperature from a chiller unit 71 is supplied to and circulated through the coolant path 70 via the pipelines 72 and 73. Further, a heater 75 is embedded in the electrostatic chuck 40. A required AC voltage is applied to the heater 75 from a non-illustrated AC power supply. A processing temperature of the wafer W on the electrostatic chuck 40 is adjusted to a required temperature through the cooling by the chiller unit 71 and the heating by the heater 75.

The substrate processing apparatus 1 may be equipped with a monitor 80 configured to monitor a pressure of the heat transfer gas supplied to the rear surface of the wafer W and a leak rate of the transfer gas leaking from the rear surface of the wafer W. In case of monitoring the pressure of the heat transfer gas, a pressure value P of the heat transfer gas is measured by a non-illustrated pressure sensor provided at the rear surface of the wafer W. The leak rate F of the heat transfer gas is measured by a non-illustrated flow rate sensor provided in the vicinity of a side surface of the wafer W, for example.

The substrate processing apparatus 1 includes a controller 100 configured to control operations of the individual components of the substrate processing apparatus 1. The controller 100 controls the operations of, for example, the gas supply source 62, the exhaust device 28, the heater 75, the DC voltage source 42, the switch 43, the matching device 34, the high frequency power supply 32, the heat transfer gas supply source 52, the motor 84, the chiller unit 71, and so forth.

The controller 100 is, for example, a computer and includes a CPU (Central Processing Unit), a RAM (Random Access Memory), a ROM (Read Only Memory), an auxiliary storage device, and so forth. The CPU is operated based on a program stored in the ROM or the auxiliary storage device or processing conditions of a plasma processing and controls the overall operation of the apparatus. Further, the controller 100 may be provided inside or outside the substrate processing apparatus 1. If the controller 100 is provided outside the substrate processing apparatus 1, the controller 100 may control the substrate processing apparatus 1 by a wired or wireless communications system.

Figure 2A:
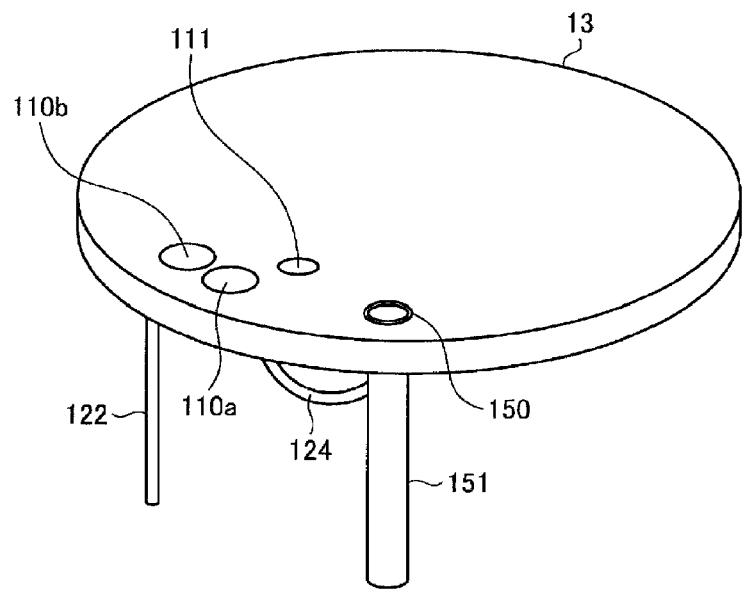
FIG. 2A is a perspective view illustrating an example configuration of a support according to the exemplary embodiment.
Figure 2B:
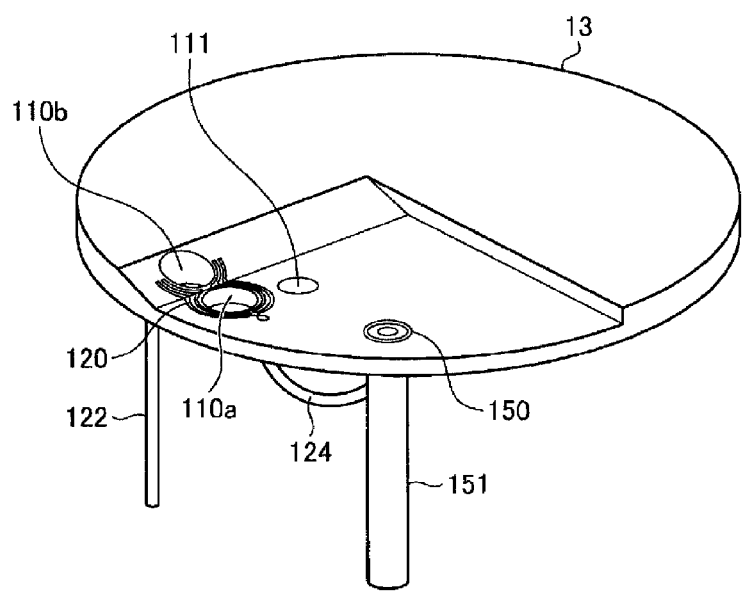
FIG. 2B is a perspective view illustrating an example configuration of the support according to the present exemplary embodiment.

Now, a configuration of the support 13 will be explained. FIG. 2A and FIG. 2B are perspective views illustrating an example configuration of the support according to the present exemplary embodiment. The support 13 is provided with through holes through which various components pass. By way of example, the support 13 is provided with through holes 110a and 110b for passing the pipelines 72 and 73 through which the coolant is circulated into the coolant path 70 provided in the placing table 12. Further, the support 13 is provided with a through hole 111 for accommodating therein the lifter pin 81. Furthermore, the support 13 is provided with a through hole 150 for passing a tube-shaped case 151 in which various kinds of pipelines are accommodated. FIG. 2B illustrates an internal configuration of a part of the support 13 in which the through holes 110a, 110b, 111 and 150 are provided. Although FIG. 2A and FIG. 2B illustrate a configuration in which the support 13 is provided with the through holes 110a, 110b, 111 and 150, the support 13 is also appropriately provided with other through holes for passing or accommodating various other components.

Figure 3:
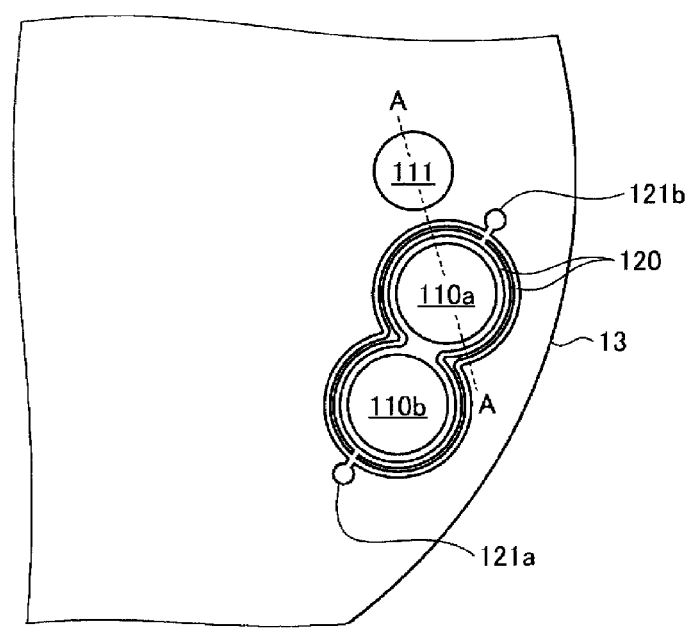
FIG. 3 is a plan view illustrating an example internal configuration of the support according to the present exemplary embodiment.
Figure 4:
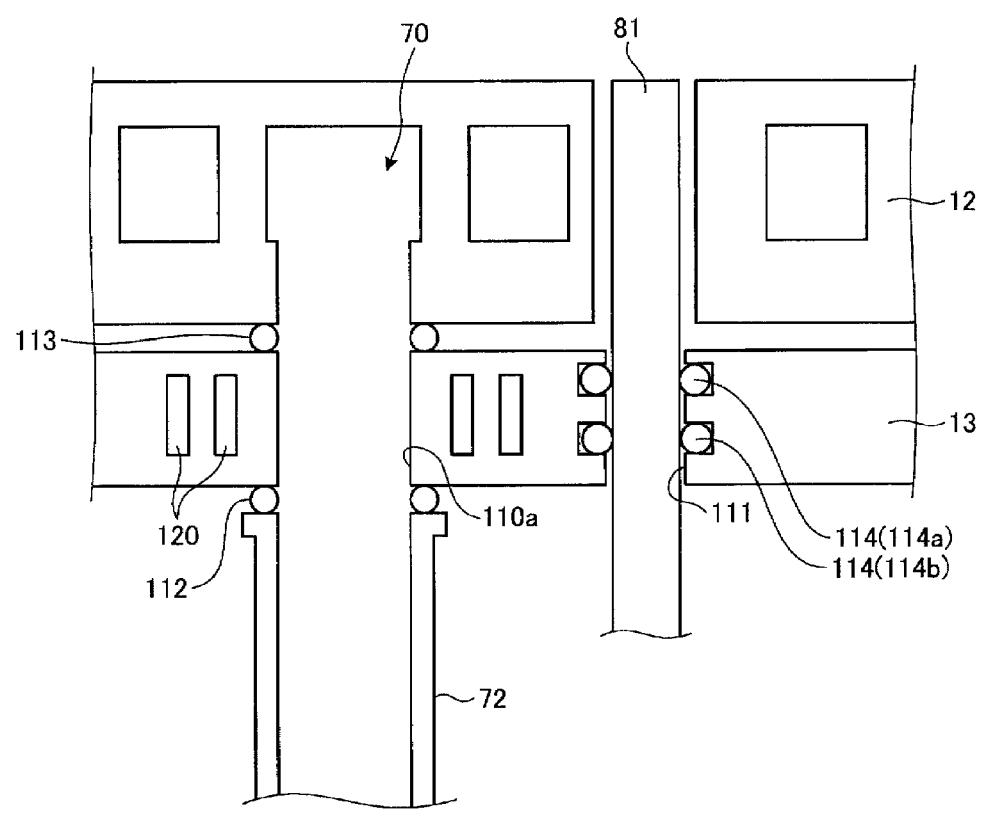
FIG. 4 is a cross sectional view schematically illustrating an example configuration of the support according to the exemplary embodiment.

FIG. 3 is a plan view illustrating an example internal configuration of the support according to the present exemplary embodiment. FIG. 3 illustrates the internal configuration of the part of the support 13 in which the through holes 110a, 110b and 111 are provided. The pipelines 72 and 73 through which the coolant passes are disposed within the through holes 110a and 110b, respectively. The lifter pin 81 is disposed within the through hole 111. FIG. 4 is a cross sectional view schematically illustrating an example cross section of the support according to the present exemplary embodiment. The example of FIG. 4 shows the cross section near the through hole 110a and the through hole 111 taken along a line A-A of FIG. 3. A seal 112 such as, but not limited to, an O-ring is provided at a bottom surface of the support 13 near the through hole 110a, and the pipeline 72 is connected thereto. Further, a seal 113 such as, but not limited to, an O-ring is provided at a top surface of the support 13 near the through hole 110a, and the coolant path 70 formed in the placing table 12 is connected thereto. The coolant is supplied into the coolant path 70 from the pipeline 72 via the through hole 110a of the support 13. Further, the substrate processing apparatus 1 according to the present exemplary embodiment may adopt a configuration in which the pipelines 72 and 73 are respectively passed through the through holes 110a and 110b of the support 13 to be connected to the coolant path 70.

The support 13 also has seals 114 such as O-rings provided at an inner side surface thereof within the through hole 111, and the lifter pin 81 is placed in this through hole 111. Here, to maintain the lifter pin 81 to be movable within the through hole 111, seals 114a and 114b are up-and-down arranged at the inner side surface of the through hole 111. To maintain the mobility of the lifer pin 81, a liquid lubricant such as, but not limited to, grease is coated on the seals 114a and 114b. Accordingly, in the support 13, the lifter pin 81 can be moved within the through hole 111 while maintaining airtightness. Further, to maintain the airtightness and the mobility appropriately, the seals 114 such as the O-rings and the liquid lubricant such as the grease need to be used under an appropriate environment including an appropriate temperature range and an appropriate stress value applied. Typically, the appropriate environment is described in catalogs or manuals of the seals 114 such as the O-rings and the liquid lubricant such as the grease. If used in an environment out of the ranges described in the catalogs or the manuals, performance of the seals 114 or the liquid lubricant may be deteriorated, and in certain situations, the seals 114 or the liquid lubricant cannot be used at all.

In a substrate processing apparatus, for example, there may be performed a substrate processing at a low temperature. For example, in the substrate processing apparatus 1 of the present exemplary embodiment, the placing table 12 is cooled by the coolant, and the plasma etching processing is performed while cooling the wafer W to a temperature of, e.g., −30° C. via the placing table 12. Here, the mentioned temperature is just an example, and the temperature may be lower than that.

The coolant of the low temperature passes through the pipelines 72 and 73 to cool the placing table 12. Accordingly, portions of the support 13 near the through holes 110a and 110b are cooled and become a low-temperature region. By way of example, a temperature of the low-temperature region becomes lower than a lower limit of a temperature which satisfies a performance requirement of at least one of the liquid lubricant and the seals 114 which are provided in a movement section where the lifter pin 81 is moved. Further, the substrate processing apparatus 1 may have a problem since an ambient temperature is further reduced due to the temperature decrease around the through holes 110a and 110b of the support 13. By way of example, in the support 13, a temperature around the through hole 111 may be dropped due to the temperature decrease around the through holes 110a and 110b, and the performance of the seals 114 or the liquid lubricant which comes into contact with the lifter pin 81 within the through hole 111 may be degraded. Accordingly, in the support 13, abrasion of the seals 114a and 114b and the lifter pin 81 may be increased. In such a case, when the lifter pin 81 is moved, the atmosphere leakage may occur at the seals 114a and 114b or the seals 114a and 114b may be cut-off, resulting in the deterioration of the airtightness. In this case, although it is desirable to choose a product of the seals 114 and the liquid lubricant whose appropriate usage environment range includes the temperature of the coolant, the appropriate product may not necessarily exist. Particularly, it is not easy to achieve both the mobility and the airtightness in an extreme range. For this reason, there may be some occasions where it is inevitable to use the temperature of the coolant which falls out of the appropriate usage environment range of the seals 114 and the liquid lubricant. If the seals 114 and the liquid lubricant are used out of the appropriate usage environment range, in particular, are used at a temperature below the lower limit of the temperature, the performance of the seals 114 and the liquid lubricant may be greatly reduced, and in some situations, the mobility and the airtightness may not be maintained. For this reason, the region where the through hole 111 is formed needs to be kept within the appropriate usage environment range of the seals 114 and the liquid lubricant. Particularly, it needs to be maintained at a temperature higher than the lower limit of the temperature. It is desirable to design the substrate processing apparatus 1 such that the through hole 111 is distanced away from the low-temperature region as far as possible. In relation to the other constituent components, however, the through hole 111 may not be placed apart from the low-temperature region in the substrate processing apparatus 1. Furthermore, if the temperature of the coolant used to cool the wafer W is higher than the lower limit of the temperature as the condition for the appropriate environment for the use of the seals 114 or the liquid lubricant, the performance of the seals 114 or the liquid lubricant may not be deteriorated even if the temperature around the through hole 111 is decreased.

As a resolution to the phenomenon that the temperature around the through hole 111 is reduced due to the temperature decrease around the through holes 110a and 110b as stated above, it may be considered to provide a heating device such as an electric heater near the through hole 111, for example. Since, however, the support 13 is connected to the high frequency power supply 32 for plasma generation, the high frequency power of, e.g., 60 MHz is applied thereto. Thus, to protect the heating device such as the electric heater, a filter and a ground line are needed. Furthermore, an electric eccentricity may be caused in the support 13, resulting in an adverse influence upon uniformity of the plasma processing in some cases.

Thus, in the present exemplary embodiment, pipe-shaped cavities 120 are formed, within the support 13, between the low-temperature region where the through holes 110a and 110b are formed and which has a relatively low temperature when the substrate processing is performed and a high-temperature region where the through hole 111 is formed and which has a relatively high temperature when the substrate processing is performed. Each cavity 120 has a rectangular cross sectional shape. The cavities 120 are disposed at preset distances from the through holes 110a and 110b to surround the through holes 110a and 110b. Accordingly, since the low-temperature region and the high-temperature region of the support 13 is not in contact with each other due to the presence of the cavities 120, the heat transmission between the low-temperature region and the high-temperature region can be suppressed. As a result, since the temperature decrease around the through hole 111 is suppressed in the substrate processing apparatus 1, the occurrence of the atmosphere leakage at the seals 114a and 114b or the deterioration of the airtightness due to the cut-off of the seals 114a and 114b can be suppressed. This configuration is particularly effective when the temperature of the low-temperature region, where the through holes 110a and 110b are formed and which has the relatively low temperature, is lower than the lower limit of the temperature as the appropriate environment for the use of the seals 114 or the liquid lubricant.

Figure 5:
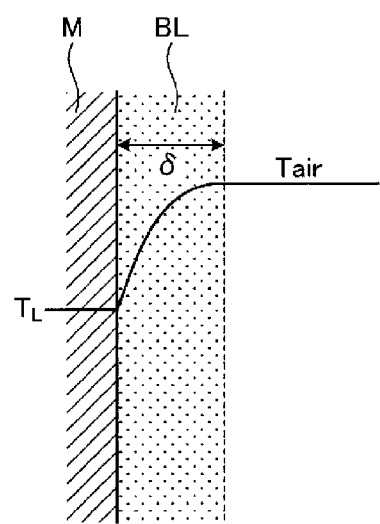
FIG. 5 is a diagram schematically illustrating heat transmission.

To suppress the heat transmission between the low-temperature region and the high-temperature region by the cavity 120 sufficiently, the cavity 120 is required to have an appropriate width. FIG. 5 is a diagram schematically illustrating the heat transmission. In general, as depicted in FIG. 5, when a matter M having a temperature $T_L$ comes into contact with a fluid (e.g., air) having a temperature $T_{air}$ different from the temperature $T_L$, a thin layer a temperature of which varies sharply from the temperature $T_L$ to the temperature $T_{air}$ is formed near the matter M. This thin layer is called a thermal boundary layer BL. A thickness δ [m] of this thermal boundary layer BL satisfies the following expression (1). Here, k [W·m$^{-1}$·K$^{-1}$] represents a thermal conductivity of the fluid, and h [W·m$^{-2}$·K$^{-1}$] denotes a heat transfer rate between the matter and the fluid.

[Expression 1]

$$\delta \approx \frac{k}{h} \qquad (1)$$

The thermal conductivity k of the fluid is a physical amount which defines a magnitude of a heat flux which is moved along, if any, a temperature gradient in a medium in thermal conduction. The thermal conductivity is decided based on the temperature and the kinds of the fluid. The heat transfer rate h is a value indicating transfer easiness of thermal energy between two kinds of matters and is decided based on temperatures and surface areas of the two kinds of matters and a velocity of the fluid. Particularly, the heat transfer rate is greatly differed depending on the velocity of the fluid. By way of example, the heat transfer rate is greatly different depending on whether it is natural convection or forced convection.

FIG. 6A to FIG. 6C are diagrams schematically illustrating a relationship between the width of the cavity 120 and the thermal boundary layer. FIG. 6A to FIG. 6C show individual cases where the width w of the cavity 120 between the low-temperature region of the temperature $T_L$ and the high-temperature region of the temperature $T_h$ is set to be wide, medium and narrow, respectively. For example, if air exists within the cavity 120 and the width of the cavity 120 is sufficiently large as illustrated in FIG. 6A, a thermal boundary layer BL1 having a thickness $\delta_1$ is formed in the cavity 120 near the low-temperature region, and a thermal boundary layer BL2 having a thickness $\delta_2$ is formed in the cavity 120 near the high-temperature region. Further, the temperature of the air between the thermal boundary layers BL1 and BL2 can maintain the temperature $T_{air}$ which is not affected by the low-temperature region and the high-temperature region. In contrast, if the width of the cavity 120 is narrow as shown in FIG. 6C, although the thermal boundary layers BL1 and BL2 are formed in the cavity 120 near the low-temperature region and the high-temperature region, respectively, these thermal boundary layers BL1 and BL2 are overlapped with each other, so that the air existing within the cavity 120 is affected by the low-temperature region and the high-temperature region in overall. For example, as shown in FIG. 6C, a temperature of the air at a middle point within the cavity 120 becomes lower than the temperature $T_{air}$, which indicates that heat is transmitted between the low-temperature region and the high-temperature region.

That is, to suppress the heat transmission between the low-temperature region and the high-temperature region, the width w of the cavity 120 needs to be equal to or larger than a sum of the thickness $\delta_1$ of the thermal boundary layer BL1 of the cavity 120 near the low-temperature region and the thickness $\delta_2$ of the thermal boundary layer BL2 of the cavity 120 near the high-temperature region, as shown in FIG. 6B. Further, a thickness of a thermal boundary layer is same regardless of a temperature as long as same fluid is used and a velocity of the fluid is same. Thus, in view of $\delta_1=\delta_2$, the width w of the cavity 120 may be set to be equal to or larger than twice the thickness $\delta_2$.

By way of example, assume that air of a room temperature exists within the cavity 120 and the forced convection of the air is generated by using a gas supply 123 to be described later. Further, the thermal conductivity of the air is set to be k=0.026 [W·m$^{-1}$·K$^{-1}$] and the heat transfer rate between a sidewall of the cavity 120 and the air is set to be h=100 [W·m$^{-2}$·K$^{-1}$]. Here, the appropriate width w (=2×$\delta_2$) of the cavity 120 becomes equal to or larger than 0.52 mm.

Further, it is desirable that the width of the cavity 120 in a thickness direction of the support 13 is in a range from 30% to 70% of a thickness of a portion of the support 13 where the cavity 120 is formed. With this configuration, it is possible to suppress the heat transmission between the low-temperature region and the high-temperature region while maintaining the mechanical strength of the support 13.

Furthermore, in the support 13 according to the present exemplary embodiment, the cavity 120 is formed to surround the entire circumferences of the through holes 110a and 110b which become the low-temperature region. However, the exemplary embodiment is not limited thereto. The cavity 120 may be formed to surround the entire circumference of the through hole 111 which becomes the high-temperature region. Further, the cavity 120 may be formed to cover at least a part of the low-temperature region near the high-temperature region or to cover at least a part of the high temperature region near the low-temperature region. The cavity 120 formed in this way is capable of suppressing the heat transmission efficiently.

Figure 7A:
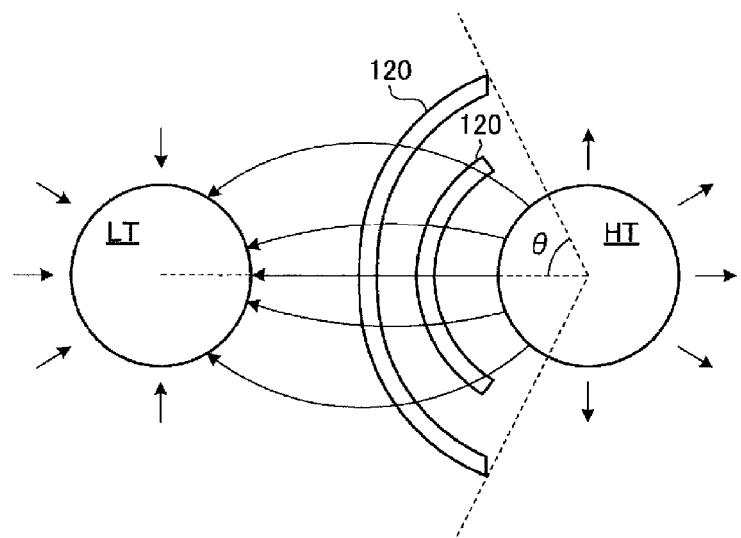
FIG. 7A is a diagram illustrating an example of the heat transmission from a high-temperature region to a low-temperature region.
Figure 7B:
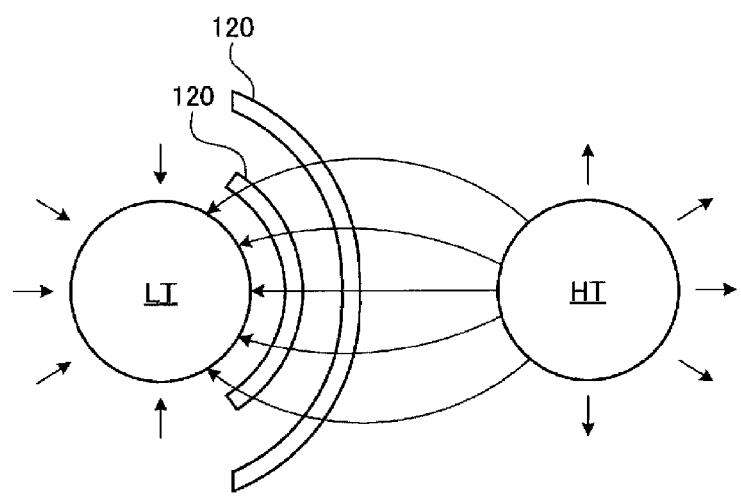
FIG. 7B is a diagram illustrating an example of the heat transmission from the high-temperature region to the low-temperature region.

FIG. 7A and FIG. 7B are diagrams illustrating examples of the heat transmission from the high-temperature region to the low-temperature region. In each of FIG. 7A and FIG. 7B, a high-temperature region HT, a low-temperature region LT and vector lines indicating a flow of the heat from the high-temperature region HT to the low-temperature region LT are illustrated. In the example of FIG. 7A, the cavities 120 are formed perpendicularly to the vector lines indicating the flow of the heat to cover a part of the high-temperature region HT near the low-temperature region LT. Meanwhile, in the example of FIG. 7B, the cavities 120 are formed perpendicularly to the vector lines indicating the flow of the heat to cover a part of the low-temperature region LT near the high-temperature region HT. Accordingly, the heat transmission between the low-temperature region and the high-temperature region can be efficiently suppressed.

It is desirable to form the cavities 120 such that ends of the cavities 120 reach a preset angular range (e.g., θ=±60°~±90°) with respect to a straight line connecting centers of the high-temperature region HT and the low-temperature region LT. By way of example, in the examples of FIG. 7A and FIG. 7B, the cavities 120 are formed such that the ends of the cavities 120 reach the preset angular range with respect to a straight line connecting a center of the through hole 111 and a center of the through hole 110a (110b). Since the heat is transmitted along the vector lines shown in FIG. 7A and FIG. 7B, the heat transmission between the low-temperature region and the high-temperature region can be further suppressed by forming the cavities 120 to reach the preset angular range.

The cavities 120 may be arranged in multiple rows and in parallel. In the support 13 according to the present exemplary embodiment, the cavities 120 are arranged in two rows. However, the cavities 120 may be arranged in more than two rows. Since the heat transmission can be suppressed at each row of the cavities 120, the heat transmission between the low-temperature region and the high-temperature region can be further suppressed by forming the cavities 120 in the multiple rows and in parallel.

Figure 8:
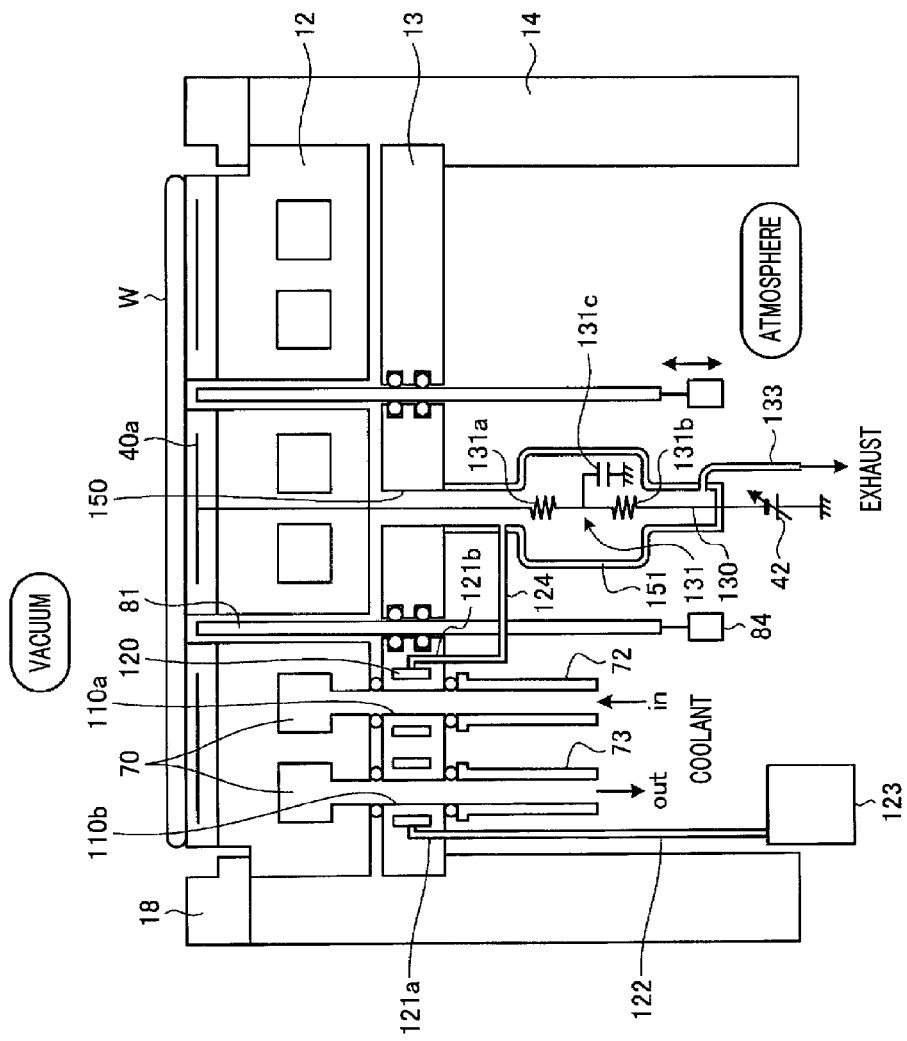
FIG. 8 is a diagram illustrating an example configuration under the support according to the present exemplary embodiment.

The support 13 is provided with a multiple number of communication holes 121 communicating with the cavities 120. By way of example, the support 13 is provided with two communication holes 121a and 121b communicating with the cavities 120, as depicted in FIG. 3. The communication hole 121a communicates with one ends of the cavities 120, and the communication hole 121b communicates with the other ends of the cavities 120. FIG. 8 is a diagram schematically illustrating an example configuration under the support according to the exemplary embodiment. The communication holes 121a and 121b communicate with the bottom surface of the support 13. The gas supply 123 is connected to the communication hole 121a via a pipeline 122.

The gas supply 123 is configured to supply the inert gas having a temperature higher than that of the low-temperature region into the pipeline 122. The inert gas may be, by way of non-limiting example, atmosphere, dry air, nitrogen, or the like. An amount of moisture contained in the inert gas is desirably smaller than a saturation water vapor amount at a surface temperature of the low-temperature region to suppress condensation. By way of example, the gas supply 123 supplies the dry air of a room temperature into the pipeline 122 as the inert gas. The inert gas supplied from the gas supply 123 is supplied into the communication hole 121a via the pipeline 122 and then into the cavities 120 from the communication hole 121a. Then, the inert gas is exhausted from the communication hole 121b after being circulated in the cavities 120. Accordingly, since the heat is supplied from the inert gas supplied into the cavities 120, the decrease of the temperature of the high-temperature region is suppressed in the substrate processing apparatus 1. Especially, since the forced convection of the inert gas takes place due to the circulation of the inert gas within the cavities 120, the heat transfer rate between the sidewalls of the cavities 120 and the inert gas is increased, so that the heat is supplied from the inert gas more efficiently. As a result, in the substrate processing apparatus 1, the temperature decrease around the through hole 111 is suppressed, and the deterioration of the performance of the seals 114 and the liquid lubricant within the through hole 111 is suppressed. Therefore, a problem at the movement section where the lifter pin 81 is moved up and down can be suppressed. By way of example, the occurrence of the atmosphere leakage at the seal 114a (114b)

or the deterioration of the airtightness due to the cut-off of the seal 114a (114b) can be suppressed. Furthermore, although the heat transfer rate between the sidewall of the cavity 120 and the inert gas is higher with a rise of the flow rate of the inert gas, the consumption of the inert gas is increased with the rise of the flow rate thereof. Thus, it is desirable to adjust the inert gas to have an appropriate flow rate based on the width w of the cavity 120 and the temperature of the low-temperature region.

The inert gas exhausted from the communication hole 121b is cooled. Thus, the inert gas exhausted from the communication hole 121b may be further used to cool a member required to be cooled. For example, a wiring 130 is disposed in the tube-shaped case 151 to connect the chuck electrode 40a and the DC voltage source 42. When the plasma processing is performed, a high frequency noise is generated in the wiring 130 due to the high frequency power supplied from the high frequency power supply 32. For the reason, the wiring 130 is provided with a filter circuit 131 configured to remove the high frequency noise. This filter circuit 131 has resistors 131a and 131b and a capacitor 131c. Heat equal to or higher than, e.g., 100° C. is generated from this filter circuit 131 due to the high frequency noise. Thus, in the substrate processing apparatus 1, the inert gas exhausted from the communication hole 121b is used to cool this filter circuit 131. In the present exemplary embodiment, one end of a pipeline 124 is connected to the communication hole 121b, and the other end of the pipeline 124 is connected to an upper portion of the filter circuit 131 of the case 151. Further, an exhaust line 133 for the exhaust thereof is connected to a lower portion of the filter circuit 131 of the case 151. With this configuration, the inert gas exhausted from the communication hole 121b passes through the vicinity of the filter circuit 131 within the case 151 via the pipeline 124, and is then exhausted from the exhaust line 133. Accordingly, in the substrate processing apparatus 1, the filter circuit 131 can be cooled by using the processing gas used to suppress the heat transmission between the high-temperature region and the low-temperature region of the support 13 without providing an additional device for cooling the filter circuit 131.

Here, as shown in FIG. 6A, if the width w of the cavity 120 is large, the heat transmission between the low-temperature region and the high-temperature region can be suppressed by the cavity 120. Thus, to thermally insulate the low-temperature region and the high-temperature region without providing the gas supply unit 123 and allowing the inert gas to pass through the cavity 120 in the substrate processing apparatus, it is desirable to set the width w of the cavity 120 to be large. For example, as shown in FIG. 6A, the width w of the cavity 120 is desirably equal to or larger than the sum of the thickness $\delta_1$ of the thermal boundary layer BL1 of the cavity 120 near the low-temperature region and the thickness $\delta_2$ of the thermal boundary layer BL2 of the cavity 120 near the high-temperature region ($w \geq \delta_1 + \delta_2$).

Meanwhile, as depicted in FIG. 6C, if the width w of the cavity 120 is small, the inert gas is cooled by being deprived of the heat by the low-temperature region. Thus, in case of using the inert gas exhausted from the communication hole 121b for the cooling in the substrate processing apparatus, it is desirable to set the width w of the cavity 120 to be small. For example, the width w of the cavity 120 is desirably equal or less than the sum of the thickness $\delta_1$ of the thermal boundary layer BL1 of the cavity 120 near the low-temperature region and the thickness $\delta_2$ of the thermal boundary layer BL2 of the cavity 120 near the high-temperature region ($w \geq \delta_1 + \delta_2$).

As stated above, the substrate processing apparatus 1 according to the present exemplary embodiment has the processing vessel 10 and the support 13. The inside of the processing vessel 10 is set to be in the vacuum atmosphere when the substrate processing is performed. In the support 13, the pipe-shaped cavities 120 are formed between the low-temperature region which reaches a relatively low temperature and the high-temperature region which reaches a relatively high temperature when the substrate processing is performed. The support 13 is configured to seal the processing vessel 10. With this configuration, the substrate processing apparatus 1 according to the present exemplary embodiment is capable of suppressing the heat transfer between the low-temperature region and the high-temperature region.

Further, the cavities 120 according to the present exemplary embodiment are formed to cover at least the high-temperature region side of the low-temperature region or to cover at least the low-temperature region side of the high-temperature region. Accordingly, the substrate processing apparatus 1 according to the present exemplary embodiment is capable of suppressing the heat transfer between the low-temperature region and the high-temperature region efficiently.

Furthermore, each cavity 120 is formed vertically with respect to the vector lines indicating the flow of the heat from the high-temperature region to the low-temperature region. Accordingly, the substrate processing apparatus 1 is capable of suppressing the heat transfer between the low-temperature region and the high-temperature region efficiently.

In addition, the cavities 120 includes multiple cavities, and multiple cavities are disposed in the multiple rows and in parallel. With this configuration, the heat transfer between the low-temperature region and the high-temperature region can be further suppressed in the substrate processing apparatus 1.

In addition, the substrate processing apparatus 1 is further equipped with the gas supply 123 configured to supply the inert gas having the temperature higher than that of the low-temperature region to allow the inert gas to flow from the one ends of the cavities 120 toward the other ends thereof. With this configuration, since the heat can be supplied from the inert gas, the substrate processing apparatus 1 is capable of suppressing the temperature decrease of the high-temperature region.

Moreover, the substrate processing apparatus 1 is further equipped with the pipeline 124 connected to the other ends of the cavities 120 and configured to guide the inert gas having passed through the cavities 120 toward the member which needs to be cooled. With this configuration, the substrate processing apparatus 1 is capable of carrying out the thermal insulation between the low-temperature region and the high-temperature region and the cooling of the member required to be cooled at the same time.

Furthermore, the width of each cavity 120 is set to be equal to or larger than the sum of the thicknesses of the thermal boundary layers respectively formed in the cavity 120 near the low-temperature region and the high-temperature region. With this configuration, in the substrate processing apparatus 1, the heat transfer between the low-temperature region and the high-temperature region can still be suppressed even if the inert gas is not flown through the cavity 120.

Additionally, the width of each cavity 120 is set to be equal to or less than the sum of the thicknesses of the thermal boundary layers respectively formed in the cavity 120 near the low-temperature region and the high-temperature region.

With this configuration, the inert gas is cooled while passing through the cavities 120, the member required to be cooled can be cooled by the cooled inert gas in the substrate processing apparatus 1.

Additionally, in the support 13 according to the present exemplary embodiment, the coolant path through which the coolant is flown is provided in the low-temperature region LT, and the movement section for the lifter pin 81 configured to move up and down the wafer W as a substrate processing target is disposed in the high-temperature region HT. Accordingly, the substrate processing apparatus 1 according to the present exemplary embodiment is capable of suppressing the temperature decrease at the movement section of the lifter pin 81, so that the problem at the movement section can be suppressed.

In addition, in the support 13 according to the present exemplary embodiment, the temperature of the low-temperature region is set to be lower than the lower limit of the temperature which satisfies the performance requirement of at least one of the liquid lubricant or the seals 114 provided in the movement section of the lifter pin 81, and the temperature of the high-temperature region is set to be higher than the lower limit. Accordingly, the substrate processing apparatus 1 according to the present exemplary embodiment is capable of suppressing the problem which might be caused by the temperature decrease in the movement section of the lifter pin 81.

So far, the exemplary embodiments have been described. However, it should be noted that the exemplary embodiments are nothing more than examples in all aspects and are not intended to be anyway limiting. The above-described exemplary embodiments can be implemented in various ways. Further, the exemplary embodiments can be omitted, replaced or modified in various ways without departing from the scope of the following claims.

Though it has been described for the case that the semiconductor wafer is used as the target object, the exemplary embodiment is not limited thereto, and the target object may be other types of the substrate such as a glass substrate or the like.

Further, though it has been described for the case that the etching is performed in the substrate processing apparatus 1, the exemplary embodiment is not limited thereto, and other plasma processings may be performed in the substrate processing apparatus 1 by generating plasma with the upper electrode.

Furthermore, though it has been described for the case where the member required to be cooled is the filter circuit 131 provided in the wiring 130 of the chuck electrode 40*a*, the exemplary embodiment is not limited thereto. The member required to be cooled may be any of various other members from which the heat is generated. By way of example, the same filter circuit may be provided in a wiring for supplying a power to the heater 75 to remove the high frequency noise. This filter circuit provided in the wiring for supplying the power to the heater 75 may be cooled.

In addition, though it has been described for the case where the inert gas exhausted from the communication hole 121*b* is used to cool the component of the apparatus, the exemplary embodiment is not limited thereto. The inert gas exhausted from the communication hole 121*b* may be used to suppress the condensation on components such as the cylindrical holder 14, the pipelines 72 and 73 and gas supply line 54 and so forth which are disposed in the lower space of processing vessel 10.

According to the exemplary embodiment, it is possible to suppress the heat transmission.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. A substrate processing apparatus, comprising:
a processing vessel whose inside is set to be in a vacuum atmosphere when a substrate processing is performed; and
a support configured as a sealing member configured to seal the processing vessel and provided with a pipe-shaped cavity formed between a low-temperature region having a relatively low temperature and a high-temperature region having a relatively high temperature when the substrate processing is performed, the support having a first through hole in the low-temperature region, and a second through hole in the high-temperature region.

2. The substrate processing apparatus of claim 1,
wherein the cavity is formed to cover at least a part of the low-temperature region near the high-temperature region or to cover at least a part of the high-temperature region near the low-temperature region.

3. The substrate processing apparatus of claim 1,
wherein the cavity is formed perpendicularly to a vector line indicating a flow of heat from the high-temperature region to the low-temperature region.

4. The substrate processing apparatus of claim 1,
wherein the cavity includes multiple cavities, and the multiple cavities are disposed in multiple rows and in parallel.

5. The substrate processing apparatus of claim 1, further comprising:
a gas supply configured to supply an inert gas having a temperature higher than a temperature of the low-temperature region to allow the inert gas to flow from one end of the cavity to the other end thereof.

6. The substrate processing apparatus of claim 5, further comprising:
a pipeline connected to the other end of the cavity and configured to guide the inert gas having passed through the cavity to a member required to be cooled.

7. The substrate processing apparatus of claim 1,
wherein a width of the cavity is set to be equal to or larger than a sum of thicknesses of thermal boundary layers respectively formed in the cavity near the low-temperature region and the high-temperature region.

8. The substrate processing apparatus of claim 5,
wherein a width of the cavity is set to be equal to or less than a sum of thicknesses of thermal boundary layers respectively formed in the cavity near the low-temperature region and the high-temperature region.

9. The substrate processing apparatus of claim 1,
wherein a path through which a coolant is flown is provided in the low-temperature region of the sealing member, and a movement section of a lifter pin configured to move a substrate as a substrate processing target up and down is provided in the high-temperature region of the sealing member.

10. The substrate processing apparatus of claim 9, wherein a temperature of the low-temperature region having the relatively low temperature is lower than a lower limit of a temperature which satisfies a performance requirement of at least one of a seal or a lubricant provided in the movement section of the lifter pin, and a temperature of the high-temperature region having the relatively high temperature is higher than the lower limit.

11. The substrate processing apparatus of claim 2, wherein the cavity is formed perpendicularly to a vector line indicating a flow of heat from the high-temperature region to the low-temperature region.

12. The substrate processing apparatus of claim 11, wherein the cavity includes multiple cavities, and the multiple cavities are disposed in multiple rows and in parallel.

13. The substrate processing apparatus of claim 12, further comprising:
a gas supply configured to supply an inert gas having a temperature higher than a temperature of the low-temperature region to allow the inert gas to flow from one end of the cavity to the other end thereof.

14. The substrate processing apparatus of claim 13, further comprising:
a pipeline connected to the other end of the cavity and configured to guide the inert gas having passed through the cavity to a member required to be cooled.

15. The substrate processing apparatus of claim 14, wherein a path through which a coolant is flown is provided in the low-temperature region of the sealing member, and a movement section of a lifter pin configured to move a substrate as a substrate processing target up and down is provided in the high-temperature region of the sealing member.

16. The substrate processing apparatus of claim 15, wherein a temperature of the low-temperature region having the relatively low temperature is lower than a lower limit of a temperature which satisfies a performance requirement of at least one of a seal or a lubricant provided in the movement section of the lifter pin, and a temperature of the high-temperature region having the relatively high temperature is higher than the lower limit.

17. The substrate processing apparatus of claim 6, wherein a width of the cavity is set to be equal to or less than a sum of thicknesses of thermal boundary layers respectively formed in the cavity near the low-temperature region and the high-temperature region.

* * * * *